United States Patent [19]
Doi et al.

[11] Patent Number: 4,653,052
[45] Date of Patent: Mar. 24, 1987

[54] METHOD FOR DECODING DOUBLE-ENCODING CODES AND APPARATUS USING THE SAME

[75] Inventors: Nobukazu Doi, Kokubunji; Morishi Izumita, Inagi; Seiichi Mita, Kanagawa; Yoshizumi Eto, Sagamihara; Morito Rokuda, Katsuta, all of Japan

[73] Assignees: Hitachi, Ltd.; Hitachi Denshi Kabushiki Kaisha, both of Tokyo, Japan

[21] Appl. No.: 750,513

[22] Filed: Jul. 1, 1985

[30] Foreign Application Priority Data

Jun. 29, 1984 [JP] Japan .................. 59-134376

[51] Int. Cl.$^4$ ............................. G06F 11/10
[52] U.S. Cl. ........................ 371/39; 371/38
[58] Field of Search .............. 371/38, 39, 40

[56] References Cited

U.S. PATENT DOCUMENTS

| | | | |
|---|---|---|---|
| 4,336,612 | 6/1982 | Inou et al. | 371/39 |
| 4,532,629 | 7/1985 | Furuya et al. | 371/38 |
| 4,541,092 | 9/1985 | Sako et al. | 371/39 |
| 4,546,474 | 10/1985 | Sako et al. | 371/39 |
| 4,559,625 | 12/1985 | Berlekamp et al. | 371/40 X |
| 4,564,945 | 1/1986 | Glover et al. | 371/38 |

Primary Examiner—Charles E. Atkinson
Attorney, Agent, or Firm—Antonelli, Terry & Wands

[57] ABSTRACT

The present invention relates to a method and an apparatus for decoding double-encoding codes in which the information to be decoded comprises a first data and a second data. The operation for decoding double-encoding codes is achieved through two stages. A decoder of the first stage checks the first data, and when an error is found in the first data, all symbols of the first data are assumed to be wrong. The first-stage decoder then adds an erasure flag to all symbols to generate erasure symbols. As a result, these erasure symbols include the symbols which are actually erroneous and those which are correct. A decoder of the second stage is used to perform an error correction on the second data. For this purpose, the second-stage decoder detects the number of erasure symbols which are contained in the second data and which are actually erroneous. If the number of actually erroneous symbols does not exceed the maximum number of correctable symbols which can be corrected by the decoder of the second stage, the error correction is effected; otherwise, the decoder detects an error without conducting the error correction.

6 Claims, 10 Drawing Figures

FIG. 7

| CIRCUIT 44 OUTPUT | CIRCUIT 45 OUTPUT | CIRCUIT 46 OUTPUT | SELECTION ERROR PATTERN |
|---|---|---|---|
| 0 | 0 | 0 | ERROR DETECTION |
| 0 | 0 | 1 | OUTPUT ERROR PATTERN OF CIRCUIT 43 |
| 0 | 1 | 0 | OUTPUT ERROR PATTERN OF CIRCUIT 42 |
| 0 | 1 | 1 | OUTPUT ERROR PATTERN OF CIRCUIT 42 OR 43 |
| 1 | 0 | 0 | OUTPUT ERROR PATTERN OF CIRCUIT 41 |
| 1 | 0 | 1 | OUTPUT ERROR PATTERN OF CIRCUIT 41 OR 43 |
| 1 | 1 | 0 | OUTPUT ERROR PATTERN OF CIRCUIT 41 OR 42 |
| 1 | 1 | 1 | OUTPUT ERROR PATTERN OF CIRCUIT 41, 42, OR 43 |

METHOD FOR DECODING DOUBLE-ENCODING CODES AND APPARATUS USING THE SAME

BACKGROUND OF THE INVENTION

The present invention relates to a method for decoding double-encoding codes and an apparatus using the same, and in particular, to an erasure correcting method and an apparatus using the same.

In communication and computer systems, there have been widely utilized error correcting codes for the purpose of the system reliability. Based on the error detecting codes, the transmitted information is checked whether or not the predetermined rules imposed thereon are satisfied. If it is found that the rules are satisfied, the information is determined to be free of errors. On the contrary, if the rules are not satisfied for the information, the system assumes that an error has been found and requests to retransmit the information, or the error is automatically corrected by use of the error correcting codes on a device for receiving the transmitted information. A Galois field has been utilized to execute such operations for detecting and correcting errors.

Recently, error correcting codes have been adopted in a PCM recording system in which audio and video signals are digitized before they are recorded.

To implement a higher error correction capability, there is a system utilizing codes with long lengths in which each code is constituted by duplicatedly encoding two kinds of codes having rather simple structure (these codes may be of the same kind). This provision allows to decode the code through two stages, hence the decoding algorithm can be advantageously simplified as compared with that used when a code which has a long code length and a high error correction capability is decoded at a time. Furthermore, these codes can be effectively processed with respect to both the burst and random errors.

The double-encoding codes include the product, concatenated, and cross interleaved codes. Among various methods for decoding double-encoding codes, the following two decoding methods are commonly used.

(a) A decoder of the first stage possesses at least an error detecting function. When the decoder detects an error in a first data, it adds an erasure flag to all symbols constituting the first data in which the error is found, thereby setting the erasure symbols. A decoder of the second stage corrects the errors in a second data based on the positional information of the erasure symbols supplied from the decoder of the first stage (erasure correcting method).

(b) The decoders of the first and second stages independently perform the respective error detecting and correcting functions. Especially, the erasure correcting method of (a) develops a practical error correction capability and requires only a simple hardware designing; therefore, it has been widely applied to the devices such as a digital audio disk (DAD) and a digital video tape recorder (DVTR).

Let us consider now the Reed-Solomon codes (to be referred to as RS codes herebelow) shown in FIG. 2 illustrating double-encoding codes, that is, product codes. Assume that a first data along the row direction is A code and that a second data along the column direction is B code. The A code is decoded together with an error detection or an error detection and correction. When an error is detected in a decode operation of the A code, an erasure flag is added to all symbols of the first data arranged in the row direction so as to generate the erasure symbols. When the B code is decoded, the erasure correction is effected by use of the erasure symbol positional information resulted from the operation to decode the A code.

For an RS (n, k) code whose code length and number of information points are n and kv, respectively, the minimum distance is represented to be $n-k+1$, so the number of erasure symbols that can be corrected is $n-k$ at the maximum. The parity check matrix H of this code is given by expression (1), where $\alpha$ represents the primitive root of a Galois field GF $(q^m)$ and the code length n is a positive integer not exceeding $q^m - 1$.

$$H = \begin{bmatrix} 1 & 1 & 1 & & 1 \\ 1 & \alpha & \alpha^2 & \cdots & \alpha^{n-1} \\ 1 & \alpha^2 & \alpha^{2\cdot 2} & & \alpha^{2(n-1)} \\ \vdots & \vdots & \vdots & & \vdots \\ 1 & \alpha^{n-k-1} & \alpha^{(n-k-1)\cdot 2} & & \alpha^{(n-k-1)(n-1)} \end{bmatrix} \quad (1)$$

Assuming the code word vector, error vector, and receive vector to be $\nabla = (v_1, v_2, \ldots v_n)$, $e = (e_1, e_2, \ldots, e_n)$, and $t = (r_1, r_2, \ldots, r_n)$, respectively, then the following expression is obtained.

$$\# = \nabla + e \quad (2)$$

Then, syndrome $\$ = (S_1, S_2, \ldots, S_{n-k})$ is defined in terms of the parity check matrix H and the receive vector $\#$ as follows.

$$\$ = \# \cdot H^T \quad (3)$$
$$= e \cdot H^T$$

where $\#^T$ and $e^T$ represent the transposed matrices of $\#$ and $e$, respectively.

Assume that the positions of the erasure symbols which are $l$ in number with $l$ not exceeding $n-k$ are represented as $a1, a2, \ldots, al$ and that the magnitudes of the errors associated therewith are expressed as $E_{a1}, E_{a2}, \ldots, E_{al}$, then there exists the following relationships between the syndromes $\$$ and the magnitudes of the errors.

$$\begin{bmatrix} S_1 \\ S_2 \\ S_3 \\ \vdots \\ S_l \end{bmatrix} = \begin{bmatrix} 1 & 1 & 1 & \ldots & 1 \\ \alpha^{a1} & \alpha^{a2} & \alpha^{a3} & \ldots & \alpha^{al} \\ \alpha^{2a1} & \alpha^{2a2} & \alpha^{2a3} & \ldots & \alpha^{2al} \\ \vdots & \vdots & \vdots & & \vdots \\ \alpha^{(l-1)a1} & \alpha^{(l-1)a2} & \alpha^{(l-1)a3} & \ldots & \alpha^{(l-1)al} \end{bmatrix} \begin{bmatrix} E_{a1} \\ E_{a2} \\ E_{a3} \\ \vdots \\ E_{al} \end{bmatrix} \quad (4)$$

The syndrome $\$ = (S_1, S_2, \ldots, S_l)$ and the erasure symbol positions $a1, a2, \ldots, al$ are known in expression (4), hence the magnitudes of the errors $E_{a1}, E_{a2}, \ldots, E_{al}$ can be obtained from expression (4) as follows.

$$\begin{bmatrix} E_{a1} \\ E_{a2} \\ E_{a3} \\ \cdot \\ \cdot \\ E_{al} \end{bmatrix} = \begin{bmatrix} 1 & 1 & 1 & \ldots & 1 \\ \alpha^{a1} & \alpha^{a2} & \alpha^{a3} & \ldots & \alpha^{al} \\ \alpha^{2a1} & \alpha^{2a2} & \alpha^{2a3} & \ldots & \alpha^{2al} \\ \cdot & & & & \\ \cdot & & & & \\ \alpha^{(l-1)a1} & \alpha^{(l-1)a2} & \alpha^{(l-1)a3} & \ldots & \alpha^{(l-1)al} \end{bmatrix}^{-1} \begin{bmatrix} S_1 \\ S_2 \\ S_3 \\ \cdot \\ \cdot \\ S_l \end{bmatrix} \quad (5)$$

where, $[A]^{-1}$ represents the inverse matrix of the matrix $[A]$. As a consequence, in the l erasure correcting method conventionally utilized to correct errors which are l in number, a circuit for solving the l-order matrix equation of expression (5) must be implemented by hardware including ROM's and logic gates.

The following paragraphs describe a concrete conventional example in which an RS ($n_H=39$, $k_H=36$) code and an RS ($n_V=31$, $k_V=28$) code in a Galois field GF ($2^8$) are used as the A and B codes, respectively.

Assume that a decoder of the A code has at least the function to detect an error and that when an error is detected, erasure flags are added to the first data in order to create erasure symbols. A decoder of the B code can perform the erasure correction on symbols which are $n_V-k_V=31-28=3$ in number at the maximum. The following two examples will be explained:
(1) Two erasure correcting method in which the erasure correction is conducted if the number of erasure symbols is at most two and the error is detected if the number is at least three, and (2) Three erasure correcting method in which the erasure correction is carried out if the number of erasure symbols is at most three and the error is detected if the number is at least four.

(1) Two erasure correcting method

When the number of erasure symbols is 0, that is, the decoder of the A code does not detect any error, the decoder of the B code determines that the data has no error if $$S_1 = S_2 = S_3 = 0 \quad (6)$$

is satisfied for the syndromes $S_1$, $S_2$, $S_3$ defined by expression (3). If the relationships of expression (6) are not satisfied, the decoder of the A code could not detect an error, hence the decoder of the B code determines that an error has occurred in the data and detects an error.

Assume that the erasure symbol position and the magnitude of the error associated therewith are repeated by i and $E_i$ when the number of erasure symbols is one, then the syndromes $S_1$, $S_2$, and $S_3$ are expressed as follows.

$$S_1 = E_i \quad (7)$$

$$S_2 = \alpha^i E_i \quad (8)$$

$$S_3 = \alpha^{2i} E_i \quad (9)$$

The magnitude of the error $E_i$ for the erasure symbol position i is represented as $E_i = S_i$ from expression (7). If the following expressions (10) obtained by substituting the value $E_i = S_i$ in the expressions (8) and (9), respectively are satisfied, the error is corrected by supressing the error $E_i$ from the erasure symbol position.

$$S_2 = \alpha^i S_1$$

$$S_3 = \alpha^{2i} S_1 \quad (10)$$

If they do not hold, an error is assumed to have occurred at other than the erasure symbol position and is therefore detected.

Assume that the erasure symbol positions and the magnitudes of the errors associated therewith are represented as i, j and Ei, Ej, respectively when the number of erasure symbols is two, then the following expressions hold for the syndromes $S_1$, $S_2$, and $S_3$.

$$S_1 = E_i + E_j \quad (11)$$

$$S_2 = \alpha^i E_i + \alpha^j E_j \quad (12)$$

$$S_3 = \alpha^{2i} E_i + \alpha^{2j} E_j \quad (13)$$

From expressions (12) and (13), the magnitude of the error Ei and Ej are represented as follows.

$$E_i = \frac{\alpha^j S_1 + S_2}{\alpha^i + \alpha^j} \quad (14)$$

From expression (11), $$E_j = E_i + S_1 \quad (15)$$

Substitute Ei and Ej obtained from expressions (14) and (15) in expression (13), then $S_3$ is represented as follows $$S_3 = \alpha^{2i} \frac{\alpha^j S_1 + S_2}{\alpha^i + \alpha^j} + \alpha^{2j} \frac{\alpha^i S_1 + S_2}{\alpha^i + \alpha^j} \quad (16)$$

If expression (16) holds, the error correction is performed by suppressing the errors attained by expressions (14) and (15) from the erasure symbol positions i and j. If expression (16) is not satisfied, an error is assumed to have occurred at other than the erasure symbol positions and is thus detected.

When the number of erasure symbols is at least three, only the error detection is conducted, that is, the error correction is not carried out.

FIG. 3 illustrates a shcematic system block diagram of a system utilizing the two erasure correcting method. A syndrome arithmetic circuit 3 calculates syndromes $S_1$, $S_2$, and $S_3$ from the decoded data having erasure symbols and inputted from an input terminal 1. A control circuit 4 selects an error detect/correct circuit based on an erasure symbol positional information inputted from an input terminal 2. It selects an error detect/correct circuit 6, 7, or 8 when the number of erasure symbols is zero, one, or two, respectively. On the other hand, when the number of erasure symbols is at least three, the control circuit 4 selects a flag generate circuit 10 so as to detect an error. An error correct circuit 9 suppresses the errors obtained by the error detect/correct circuits 6, 7, and 8 from the reproduced data delayed by a delay circuit 5 so as to correct the errors. The data of which the errors have been corrected by the error correct circuit 9 is outputted from an output terminal 11. The flag generate circuit 10 generates an error flag to detect an error when an error is found at other than the erasure symbol positions in the error detect/correct circuits 6, 7, and 8, that is, the expressions (6), (10), and (16) are not satisfied, or when the control circuit 4 determines that the number of erasure symbols exceeds three. The error flag is outputted from an output terminal 12 in this case.

(2) Three erasure correcting method

When the number of erasure symbols is at most two, the erasure correction is conducted in the same manner as the two erasure correcting method described before.

Assume that the erasure symbol positions are i, j, and k and that the magnitudes of the errors associated therewith are Ei, Ej, and Ek, respectively when the number of erasure symbols is three, then the syndromes $S_1$, $S_2$, and $S_3$ are expressed as follows.

$$\begin{bmatrix} S_1 \\ S_2 \\ S_3 \end{bmatrix} = \begin{bmatrix} 1 & 1 & 1 \\ \alpha^i & \alpha^j & \alpha^k \\ \alpha^{2i} & \alpha^{2j} & \alpha^{2k} \end{bmatrix} \begin{bmatrix} Ei \\ Ej \\ Ek \end{bmatrix} \quad (17)$$

From this equation, the magnitudes of the errors Ei, Ej, and Ek are obtained from the following expressions (18) to (20).

$$Ei = \frac{1}{\Delta} \begin{vmatrix} S_1 & 1 & 1 \\ S_2 & \alpha^j & \alpha^k \\ S_3 & \alpha^{2j} & \alpha^{2k} \end{vmatrix} \quad (18)$$

$$= \frac{(\alpha^{j+2k} + \alpha^{2j+k})S_1 + (\alpha^{2j} + \alpha^{2k})S_2 + (\alpha^j + \alpha^k)S_3}{\alpha^{i+2j} + \alpha^{2+2k} + \alpha^{k+2i} + \alpha^{2i+j} + \alpha^{2j+k} + \alpha^{2k+i}}$$

$$Ej = \frac{1}{\Delta} \begin{vmatrix} 1 & S_1 & 1 \\ \alpha^i & S_2 & \alpha^k \\ \alpha^{2i} & S_3 & \alpha^{2k} \end{vmatrix} \quad (19)$$

$$= \frac{(\alpha^{k+2i} + \alpha^{2k+i})S_1 + (\alpha^{2k} + \alpha^{2i})S_2 + (\alpha^k + \alpha^i)S_3}{\alpha^{i+2j} + \alpha^{j+2k} + \alpha^{k+2i} + \alpha^{2i+j} + \alpha^{2j+k} + \alpha^{2k+i}}$$

$$Ek = \frac{1}{\Delta} \begin{vmatrix} 1 & 1 & S_1 \\ \alpha^i & \alpha^j & S_2 \\ \alpha^{2i} & \alpha^{2j} & S_3 \end{vmatrix} \quad (20)$$

$$= \frac{(\alpha^{i+2j} + \alpha^{2i+j})S_1 + (\alpha^{2i} + \alpha^{2j})S_2 + (\alpha^i + \alpha^j)S_3}{\alpha^{i+2j} + \alpha^{j+2k} + \alpha^{k+2i} + \alpha^{2i+j} + \alpha^{2j+k} + \alpha^{2k+i}}$$

Where, $$\Delta = \begin{vmatrix} 1 & 1 & 1 \\ \alpha^i & \alpha^j & \alpha^k \\ \alpha^{2i} & \alpha^{2j} & \alpha^{2k} \end{vmatrix}$$

The errors obtained from the expressions (18) to (20) are eliminated from the erasure symbol positions i, j, and k, thereby performing the error correction.

If the number of erasure symbols is at least four, the error detection is conducted.

FIG. 4 depicts a schematic block diagram of a system using three erasure correcting method.

A syndrome arithmetic circuit 15 calculates syndromes $S_1$, $S_2$, and $S_3$ based on the decoded data having erasure symbols inputted from an input terminal 13. A control circuit 16 selects an error detect/correct circuit depending on an erasure symbol positional information inputted from an input terminal 14. It selects an error detect/correct circuit 18, 19, 20, or 21 if the number of erasure symbol is zero, one, two, or three, respectively. On the other hand, if the number of erasure symbols is at least four, the control circuit 16 selects a flag generate circuit 23 in order to detect an error. An error correct circuit 22 suppresses the errors obtained by the error detect/correct circuits 18 to 21 from the reproduced data delayed by a delay circuit 17, thereby performing the error correction. The data of which the errors have been corrected by the error correct circuit is outputted from an output terminal 24. A flag generate circuit 23 generates an error flag to detect an error when an error is found at other than the erasure symbol positions in the error detect/correct circuits 18 to 21, that is, the expressions (6), (10), (16), and (17) are not satisfied, or if the control circuit 16 determines that the number of erasure symbols is at least four. The error flag thus generated is outputted from an output terminal 25.

In the two and three erasure correcting methods described above, the decoding operation becomes complex mainly because of the expressions (18) to (20) to be executed over the Galois field GF ($q^m$). As can be clear from the comparison between the numbers of arithmetic operations of expressions (14) to (16) and (18) to (20) in the Galois field, the number of hardware elements of the decoder exponentially increases as the number of erasures becomes greater.

In order to attain a higher reliability, the number of error correction is required to be increased; however, since the increase thereof causes the quantity of hardware elements to become exponentially greater, the erasure correcting method using three or more erasures cannot be easily applied to the practical use.

SUMMARY OF THE INVENTION

It is therefore an object of the present invention to provide a method for decoding a double-encoding code using an erasure correcting method which is capable of preventing the increase in the hardware quantity even when the error correction capability is improved and to provide an apparatus utilizing the decoding method.

In accordance with the present invention, double-encoding codes to which erasure flags are added are inputted to the first data and the second data including the double-encoding codes is checked for an error by use of the erasure flags. When the double-encoding codes are decoded, the number of symbols of the second data to which the erasure flags are added and which are found to be actually erroneous (that is, the number of erroneous symbols to which the erasure flags are added) is detected. If the number of errors does not exceed the number of symbols which can be corrected in the pertinent erasure correcting method, the error in the second data is corrected, whereas if it is greater than the number of correctable symbols, the error in the second data cannot be corrected and is hence detected.

This provision allows to improve the error correction capability in the operation to decode the double-encoding codes, and at the same time, brings forth an effect to prevent the increase in the number of hardware elements.

BRIEF DESCRIPTION OF THE DRAWINGS

FIG. 7 is an explanatory diagram useful to understand an example of the operation conducted by the error pattern select circuit of FIG. 6;

DESCRIPTION OF THE PREFERRED EMBODIMENTS

Figure 1:
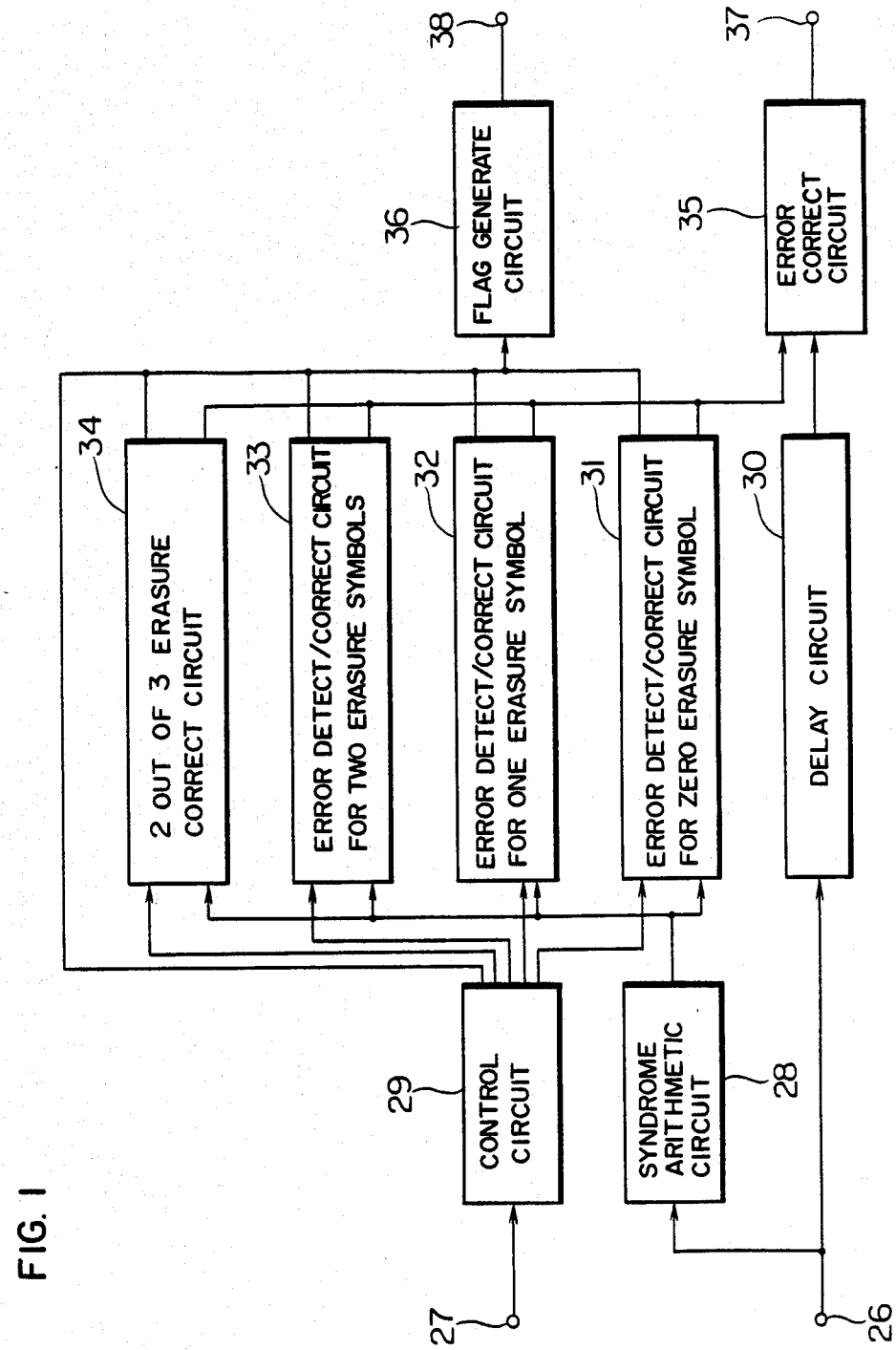
FIG. 1 is a schematic block diagram of a system utilizing the 2 out of 3 erasure correcting method embodying the present invention.
Figure 2:
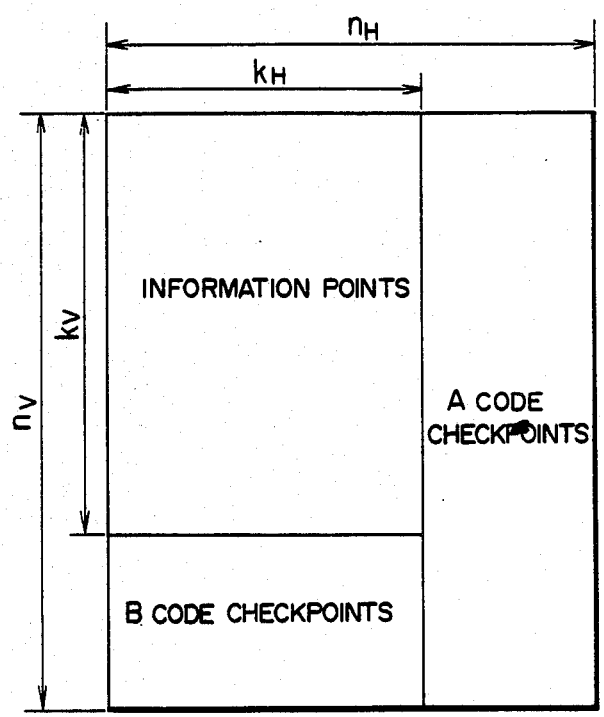
FIG. 2 is a configuration diagram illustrating product codes including the A and B codes.
Figure 3:
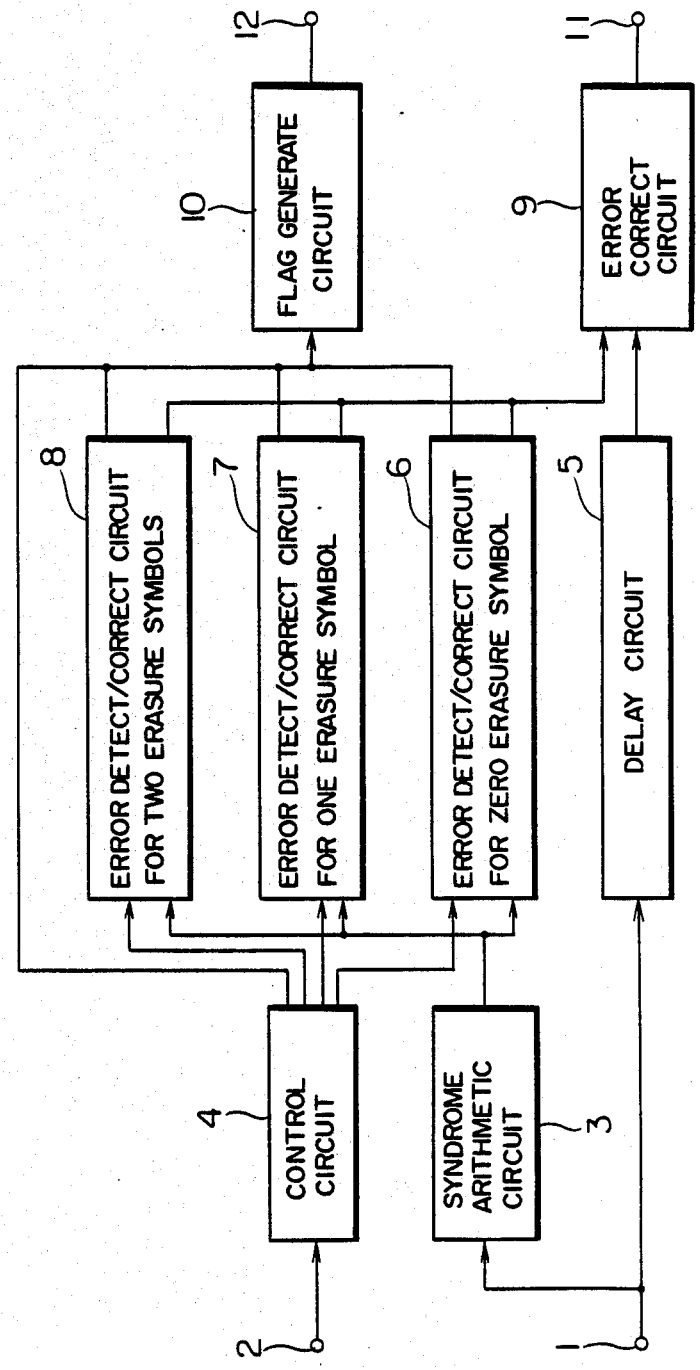
FIG. 3 is a schematic block diagram of a system using the conventional two erasure correcting method.
Figure 4:
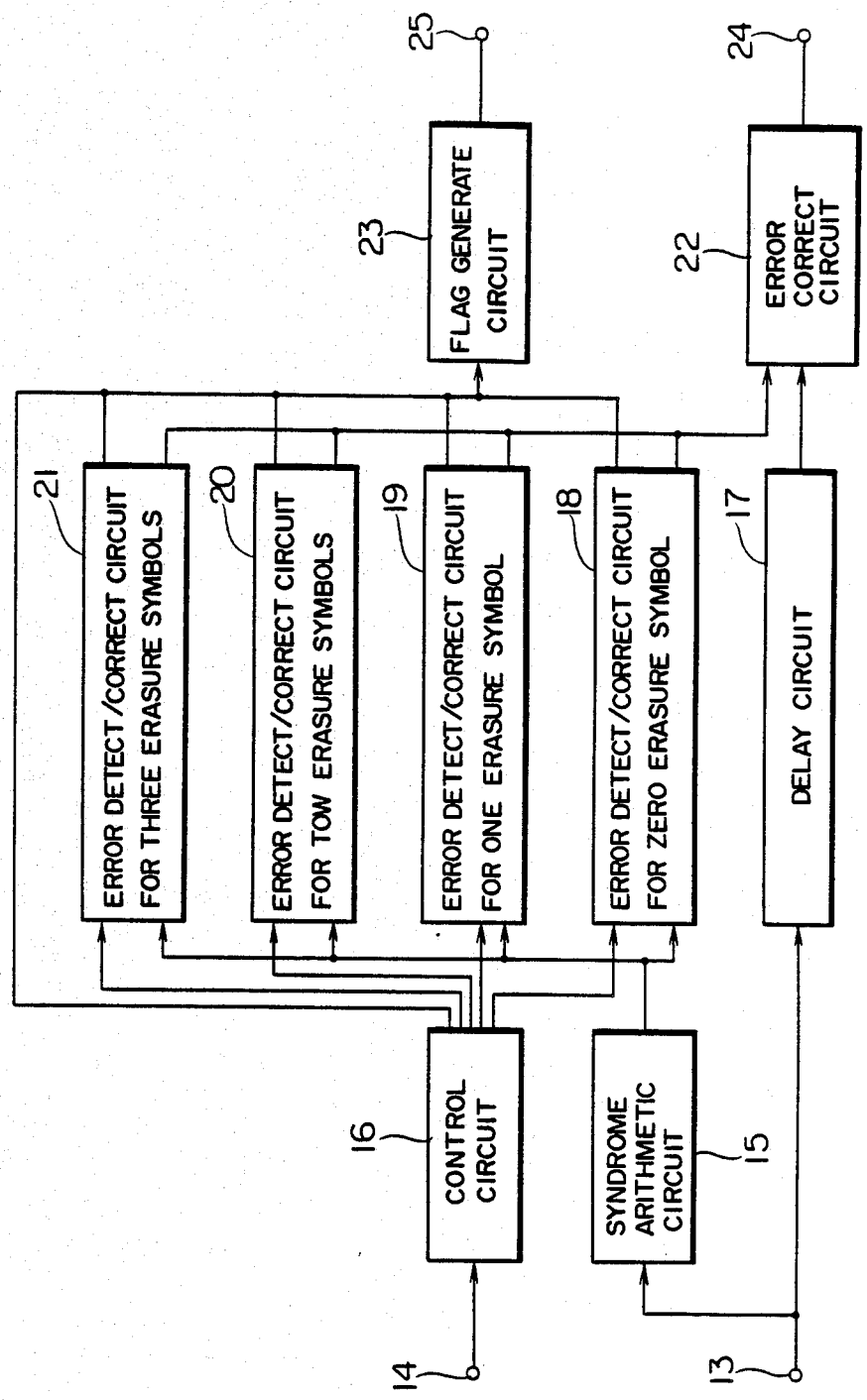
FIG. 4 is a system block diagram of a system using the conventional three erasure correcting method.

Before proceeding to the explanation of embodiments of the present invention, the principle thereof will be described.

The conventional erasure correcting methods have been designed on the assumption that an error occurs in all erasure symbols. In order to check the validity of the assumption, the probability of the erasure symbols to which the erasure flag is added and which are found to be actually erroneous will be calculated. Consider two examples: (3) 3 error detection and (4) 1 error correction 2 error detection in decoding the A code. In both cases of (3) and (4), when an error is detected, the erasure flag is added to all symbols of the data to create the erasure symbols. As the code error, the random error is assumed. The bit error rate under this condition is represented by p.

(3) 3 error detection in decoding the A code

The probability P of erroneous symbols in the Galois field GF ($2^8$) is expressed by use of the bit error rate p as follows.

$$P = 1 - (1-p)^8 \quad (21)$$

Any errors which are at most three in number can be detected in the A code; however, the errors which are at least four in number cannot be detected in some cases. If the bit error rate p is assumed to be sufficiently small, the probability of detecting failure can be approximated by the probability of decoding failure Pc obtained by assuming that all errors can be detected, that is, $$Pc \approx \sum_{i=1}^{39} {}_{39}C_i P^i (1-P)^{39-i} \quad (22)$$

As a consequence, the average number of erroneous symbols Ne when the error detection is carried out is expressed as follow.

$$Ne \approx \frac{1}{Pc}\left( \sum_{i=1}^{39} i \cdot {}_{39}C_i P^i (1-P)^{39-i} \right) \quad (23)$$

The probability $P_E$ of the erasure symbols which are found to be actually erroneous is therefore represented as follows.

$$P_E \approx \frac{Ne}{39} \quad (24)$$

(4) 1 error correction 2 error detection in decoding the A code

Similarly to the case of (3), the probability of detecting failure P'c in the A code is expressed as $$P'c \approx \sum_{i=2}^{39} {}_{39}C_i P^i (1-P)^{39-i} \quad (25)$$

Consequently, the average number of error symbols N'e when the error detection is carried out is obtained as follows $$N'e \approx \frac{1}{P'c}\left( \sum_{i=2}^{39} i \cdot {}_{39}C_i P^i (1-P)^{39-i} \right) \quad (26)$$

The probability $P'_E$ of the erasure symbols which are found to be actually erroneous is expressed as, $$P'_E \approx \frac{N'e}{39} \quad (27)$$

Figure 5:
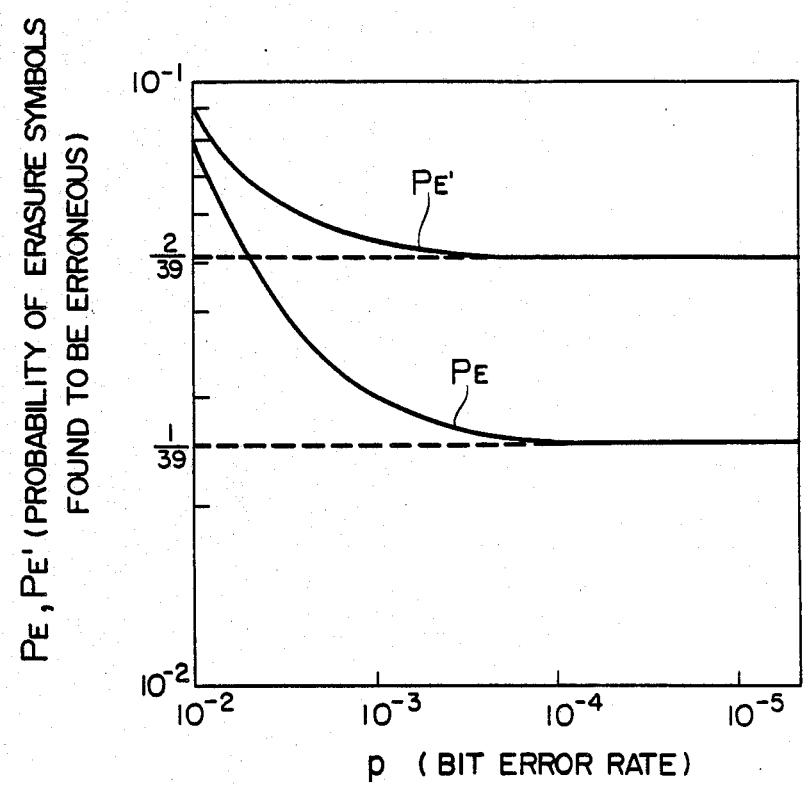
FIG. 5 is a graph illustrating the correspondences between the probability of erasure symbols found to be actually erroneous and the bit error rate.

FIG. 5 is a graph showing the correspondence between the bit error rate p and the probability of erasure symbols to be found actually erroneous.

As depicted in FIG. 5, the values of probability of the erasure symbols in which errors are actually found in the methods of (3) and (4) are $P_E \approx 1/39$ and $P'_E \approx 2/39$, respectively, if the bit error rate p is at most $1.0 \times 10^{-4}$.

Assume here that three erasure symbols are set to a code word represented in the B code system. In this case, when the decoding methods of (3) and (4) are applied to the decoding operation on the A code, the probability that the error is found in the erasure symbols in both method will be represented as $P_E^3$ and $P'_E^3$, respectively. If the bit error rate p is at most $1.0 \times 10^{-4}$, the values of probability becomes sufficiently small as $P_E^3 \approx 1.7 \times 10^{-5}$ and $P'_E^3 \approx 1.4 \times 10^{-4}$, respectively. It should be understood therefore that the error correction capability is prevented from decreasing so much even if the quantity of hardware elements is lowered by limiting the number of correctable erroneous symbols contained in the erasure symbols without establishing the assumption of the conventional methods that an error occurs in all erasure symbols. Based on this fact, the number of correctable erroneous symbols is limited in the present invention. The method for limiting the number will be described later.

In the description above, the random error is assumed as the code error. With the burst error assumed as the code error, if the burst length is short or if the burst error density (ratio of errors in the burst error) is low, the error correction capability is not greatly lowered even when the amount of hardware elements is decreased by limiting the number of correctable erroneous symbols contained in the erasure symbols like in the case of the random error.

The principle of the present invention has been described hereabove.

The following paragraphs describe the method for limiting the number of correctable erroneous symbols contained in the erasure symbols in accordance with the present invention. In this specification, an erasure correcting method in which the error correction is possible when the number of symbols which are contained in the erasure symbols l in number and which are found to be actually erroneous is at most m is referred to as m out of l erasure correcting method.

Assuming the magnitudes of the errors in the erasure symbols l in number to be represented as $E_{a1}, E_{a2}, \ldots, E_{al}$, when the erasure symbols l−m in number selected therefrom are correct, that is, $E_{b1}=E_{b2}=\ldots=E_{b(l-m)}=0$, the correspondence between the magnitudes of the errors, $E_{c1}, E_{c2}, \ldots, E_{cm}$ and the syndromes of the remaining erasure symbols m in number is expressed as follows.

$$\begin{bmatrix} S_1 \\ S_2 \\ S_3 \\ \vdots \\ S_m \end{bmatrix} = \begin{bmatrix} 1 & 1 & 1 & \ldots & 1 \\ \alpha^{c1} & \alpha^{c2} & \alpha^{c3} & \ldots & \alpha^{cm} \\ \alpha^{2c1} & \alpha^{2c2} & \alpha^{2c3} & \ldots & \alpha^{2cm} \\ \vdots & \vdots & \vdots & & \vdots \\ \alpha^{(m-1)c1} & \alpha^{(m-1)c2} & \alpha^{(m-1)c3} & & \alpha^{(m-1)cm} \end{bmatrix} \begin{bmatrix} E_{c1} \\ E_{c2} \\ E_{c3} \\ \vdots \\ E_{cm} \end{bmatrix} \quad (28)$$

From expression (28), the magnitude of the error $E_{c1}$, $E_{c2}, \ldots, E_{cm}$ is obtained as, $$\begin{bmatrix} E_{c1} \\ E_{c2} \\ E_{c3} \\ \vdots \\ E_{cm} \end{bmatrix} = \begin{bmatrix} 1 & 1 & 1 & \ldots & 1 \\ \alpha^{c1} & \alpha^{c2} & \alpha^{c3} & \ldots & \alpha^{cm} \\ \alpha^{2c1} & \alpha^{2c2} & \alpha^{2c3} & \ldots & \alpha^{2cm} \\ \vdots & \vdots & \vdots & & \vdots \\ \alpha^{(m-1)c1} & \alpha^{(m-1)c2} & \alpha^{(m-1)c3} & \ldots & \alpha^{(m-1)cm} \end{bmatrix}^{-1} \begin{bmatrix} S_1 \\ S_2 \\ S_3 \\ \vdots \\ S_m \end{bmatrix} \quad (29)$$

In order to limit the number of correctable erroneous symbols contained in the erasure symbols, it is necessary to detect the positions for which the magnitude of the error is 0, that is, the positions of the correct erasure symbols not having a symbol error. In the m out of l erasure correcting method, prior to the determination of the magnitude of the error from expression (29), the erasure symbol portions which are l−m in number and for which the magnitude of the error is 0 must be detected among the erasure symbols l in number. This operation can be performed according to the error position determination rule to be described in the following paragraphs.

[Error position determination rule]

The relationship, $E_{b1}=E_{b2}=\ldots=E_{b(l-m)}=0$, holds only when the following expression is satisfied.

$$\begin{pmatrix} S_{m+1} \\ S_{m+2} \\ S_{m+3} \\ \vdots \\ S_l \end{pmatrix} = \begin{pmatrix} \alpha^{mc1} & \alpha^{mc2} & \alpha^{mc3} & \ldots & \alpha^{mcm} \\ \alpha^{(m+1)c1} & \alpha^{(m+1)c2} & \alpha^{(m+1)c3} & \ldots & \alpha^{(m+1)cm} \\ \alpha^{(m+2)c1} & \alpha^{(m+2)c2} & \alpha^{(m+2)c3} & \ldots & \alpha^{(m+2)cm} \\ \vdots & \vdots & \vdots & & \vdots \\ \alpha^{(l-1)c1} & \alpha^{(l-1)c2} & \alpha^{(l-1)c3} & \ldots & \alpha^{(l-1)cm} \end{pmatrix} \begin{pmatrix} E_{c1} \\ E_{c2} \\ E_{c3} \\ \vdots \\ E_{cm} \end{pmatrix} \quad (30)$$

where, $E_{c1}, E_{c2}, \ldots, E_{cm}$ are represented by expression (29).

The proof of expression (30) will be given herebelow.

When expression (4) is an orthogonal matrix equation, there exists only one kind of error pattern that satisfies the expression (4). Since determinant | | is a van der Monde determinal, its value cannot become 0.

$$| \; | = \begin{vmatrix} 1 & 1 & 1 & \ldots & 1 \\ \alpha^{a1} & \alpha^{a2} & \alpha^{a3} & \ldots & \alpha^{al} \\ \alpha^{2a1} & \alpha^{2a2} & \alpha^{2a3} & \ldots & \alpha^{2al} \\ \vdots & \vdots & \vdots & & \vdots \\ \alpha^{(l-1)a1} & \alpha^{(l-1)a2} & \alpha^{(l-1)a3} & \ldots & \alpha^{(l-1)al} \end{vmatrix} \quad (31)$$

$$= \prod_{i>j} (\alpha^{ai} - \alpha^{aj}) \neq 0$$

As a consequence, expression (4) is an orthogonal matrix equation and the error pattern can be uniquely determined. Under these conditions, the error pattern satisfies expression (30). This means that expression (4) is also satisfied, namely, expression (30) is uniquely determined. That is, the error position determination rule of expression (30) has been proved to be true.

As described before, when designing a circuit for solving such matrix equations as expressions (5), (29), and (30), the amount of hardware elements exponentially increases as the order of the matrix becomes greater. In the conventional l erasure correcting method which can correct the erasure symbol up to l in number, the l-order matrix equation of expression (5) must be solved. In contrast, the lower-order matrices, that is, the m-order matrix of expression (29) and the (l−m)-order matrix of expression (30) need only be solved in the m out of l erasure correcting method of the present invention, hence the amount of hardware elements can be greatly reduced because the orders of the matrices to be solved are lowered.

The present invention will be described in detail with reference to the 2 out of 3 and 1 out of 3 erasure correcting methods as examples.

(5) 2 out of 3 erasure correcting method

When the number of erasure symbols is at most two, the erasure correction is conducted in accordance with the two erasure correcting method described in conjunction with the prior art methods.

Assume that the erasure symbol positions are i, j, and k and the magnitudes of the errors associated therewith are Ei, Ej, and Ek when the number of erasure symbols is three, then expression (17) described in the explanation of the conventional 3 erasure correcting method holds between the syndromes and the magnitudes of the errors. If Ei is zero, Ej and Ek can be solved from expression (17) as follows.

$$\begin{pmatrix} S_1 \\ S_2 \end{pmatrix} = \begin{pmatrix} 1 & 1 \\ \alpha^j & \alpha^k \end{pmatrix} \begin{pmatrix} Ej \\ Ek \end{pmatrix} \quad (32)$$

$$Ej = \frac{1}{\Delta_1} \begin{vmatrix} S_1 & 1 \\ S_2 & \alpha^k \end{vmatrix} \quad (33)$$

$$= \frac{\alpha^k S_1 + S_2}{\alpha^j + \alpha^k}$$

$$E_k = S_1 + E_j \quad (34)$$

where, $$\Delta_1 = \begin{vmatrix} 1 & 1 \\ \alpha^j & \alpha^k \end{vmatrix} = \alpha^j + \alpha^k$$

Similarly, if $E_j$ is zero, $E_i$ and $E_k$ are solved as follows.

$$E_i = \frac{1}{\Delta_2} \begin{vmatrix} S_1 & 1 \\ S_2 & \alpha^k \end{vmatrix} \quad (35)$$

$$= \frac{\alpha^k S_1 + S_2}{\alpha^k + \alpha^i}$$

$$E_k = S_1 + E_i \quad (36)$$

$$\Delta_2 = \begin{vmatrix} 1 & 1 \\ \alpha^i & \alpha^k \end{vmatrix} = \alpha^k + \alpha^i$$

Similarly, if $E_k$ is zero, $E_i$ and $E_j$ are solved as follows.

$$E_i = \frac{1}{\Delta_3} \begin{vmatrix} S_1 & 1 \\ S_2 & \alpha^j \end{vmatrix} \quad (37)$$

$$= \frac{\alpha^j S_1 + S_2}{\alpha^i + \alpha^j}$$

$$E_j = S_1 + E_i \quad (38)$$

where, $$\Delta_3 = \begin{vmatrix} 1 & 1 \\ \alpha^i & \alpha^j \end{vmatrix} = \alpha^i + \alpha^j$$

In accordance with the error portion determination rule, the case of $E_i=0$ holds only when the following expression is satisfied.

$$S_3 = \alpha^{2j} \frac{1}{\Delta_1} \begin{vmatrix} S_1 & 1 \\ S_2 & \alpha^k \end{vmatrix} + \alpha^{2k} \frac{1}{\Delta_1} \begin{vmatrix} 1 & S_1 \\ \alpha^j & S_2 \end{vmatrix} \quad (39)$$

$$= \alpha^{j+k} S_1 + (\alpha^j + \alpha^k) S_2$$

Similarly, the cases of $E_j=0$ and $E_k=0$ hold only when the following expressions (40) and (41) are respectively satisfied.

$$S_3 = \alpha^{2i} \frac{1}{\Delta_2} \begin{vmatrix} S_1 & 1 \\ S_2 & \alpha^k \end{vmatrix} + \alpha^{2k} \frac{1}{\Delta_2} \begin{vmatrix} 1 & S_1 \\ \alpha^i & S_2 \end{vmatrix} \quad (40)$$

$$= \alpha^{k+i} S_1 + (\alpha^k + \alpha^i) S_2$$

$$S_3 = \alpha^{2i} \frac{1}{\Delta_3} \begin{vmatrix} S_1 & 1 \\ S_2 & \alpha^j \end{vmatrix} + \alpha^{2j} \frac{1}{\Delta_3} \begin{vmatrix} 1 & S_1 \\ \alpha^j & S_2 \end{vmatrix} \quad (41)$$

$$= \alpha^{i+j} S_1 + (\alpha^i + \alpha^j) S_2$$

Consequently, when expression (30) holds, the errors obtained from expressions (33) and (34) are suppressed from the erasure symbol positions j and k, thereby performing the error correction. In the similar fashion, when expressions (40) and (41) hold, the errors obtained from expressions (35) and (36) and expressions (37) and (38), respectively, are eliminated to conduct the error correction. When none of expressions (39), (40), and (41) holds, the error is assumed to have occurred in all three erasure symbols and the error correction is accordingly carried out.

When the number of erasure symbols is at least four, the error detection is achieved.

FIG. 1 depicts a schematic block diagram of a system utilizing the 2 out of 3 erasure correcting method.

A syndrome arithmetic circuit 28 calculates syndromes $S_1$, $S_2$, and $S_3$ from the reproduced data inputted from an input terminal 26. A control circuit 29 selects an error detect/correct circuit based on an erasure symbol positional information inputted from an input terminal 27. It selects error detect/correct circuits 31, 32, 33, and 2 out of 3 erasure correct circuit 34 when the number of erasure symbols are 0, 1, 2, and 3, respectively. If the number of erasure symbols exceeds three, the control circuit 29 selects a flag generate circuit 36 so as to detect an error. An error correct circuit 35 suppresses the errors obtained by the error detect/correct circuits 31 to 33 and 2 out of 3 erasure correct circuit 34 from the reproduced data delayed by a delay circuit 30, thereby performing an error correction. The data of which the errors have been corrected is outputted from an output terminal 37. When an error is found in other than the erasure symbols in the error detect/correct circuits 31 to 33 and 2 out of 3 erasure correct circuit 34 or when the number of erasure symbols exceeds three, the flag generate circuit 36 generates an error flag to detect an error. The error flag is outputted from an output terminal 38 in this case.

Figure 6:
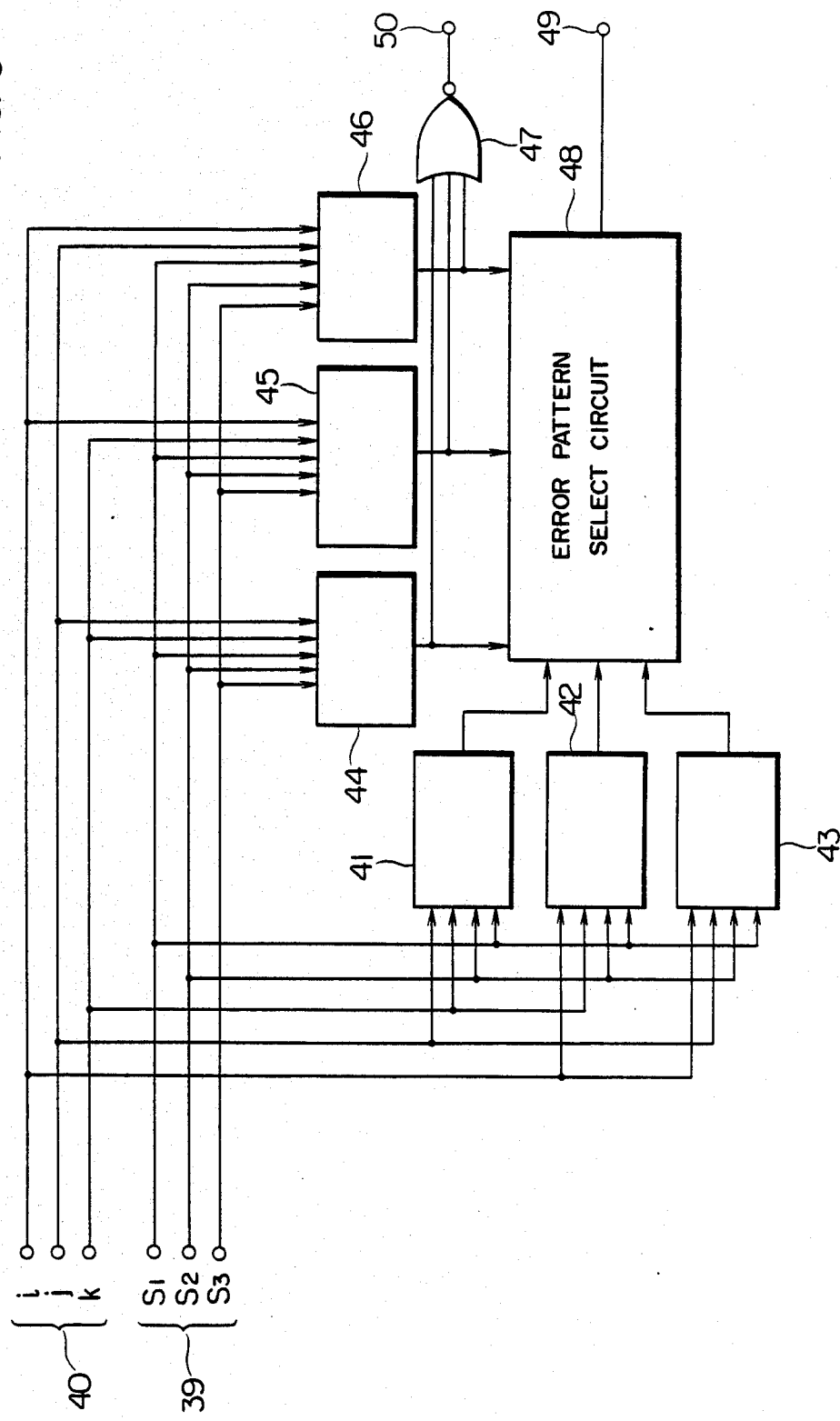
FIG. 6 is a schematic block diagram illustrating in detail the 2 out of 3 erasure correct circuit of FIG. 1.

FIG. 6 is a block diagram illustrating in detail the 2 out of 3 erasure correct circuit of FIG. 1.

Input terminals 39 and 40 are connected to the syndrome arithmetic circuit 28 and the control circuit 29, respectively. Circuits 41, 42, and 43 calculate error patterns from expressions (33) to (38) by use of the syndromes $S_1$ and $S_2$ inputted from the input terminal 39 and the erasure symbol positional information i, j, and k inputted from the input terminal 40. Circuits 44, 45, and 46 calculate expressions (39) to (41) by using the syndromes $S_1$, $S_2$, and $S_3$ and the erasure symbol positional information i, j, and k. If the associated expressions are satisfied, the relevant circuits output '1'; otherwise, they output '0'. Reference numeral 48 indicates an error pattern select circuit which selects a correct error pattern from the error patterns calculated by use of expressions (33) to (38) based on the output results from the circuits 44, 45, and 46. The error pattern thus selected is outputted from an output terminal 49. FIG. 7 is a table outlining a concrete example of pattern selection by the error pattern select circuit 48.

A NOR gate 47 outputs '1' when the error occurs in all three data items to which the erasure symbol is added, that is, when the circuit 44 to 46 each outputs '0'. The output of '1' is delivered as an error flag from an output terminal 50.

(6) 1 out of 3 erasure correcting method

When the number of erasure symbols is three, $E_k$ is expressed as follows for $E_i=E_j=0$.

$$E_k = S_1 \qquad (42)$$

Similarly, when the number of erasure symbols is three, $E_i$ is expressed as follows for $E_j=E_k=0$.

$$E_i = S_1 \qquad (43)$$

Similarly, when the erasure symbols is three, $E_j$ is expressed as follows for $E_k=E_i=0$.

$$E_j = S_1 \qquad (44)$$

In accordance with the error position determination rule, $E_i=E_j=0$ is satisfied when the following expressions hold.

$$\left. \begin{array}{l} S_2 = a^k S_1 \\ S_3 = a^{2k} S_1 \end{array} \right\} \qquad (45)$$

Similarly, $E_j=E_k=0$ and $E_k=E_i=0$ hold when the following expressions (46) and (47) are respectively satisfied.

$$\left. \begin{array}{l} S_2 = a^i S_1 \\ S_3 = a^{2i} S_1 \end{array} \right\} \qquad (46)$$

$$\left. \begin{array}{l} S_2 = a^i S_1 \\ S_3 = a^{2j} S_1 \end{array} \right\} \qquad (47)$$

When the number of erasure symbols exceeds three, the error is detected.

Figure 8:
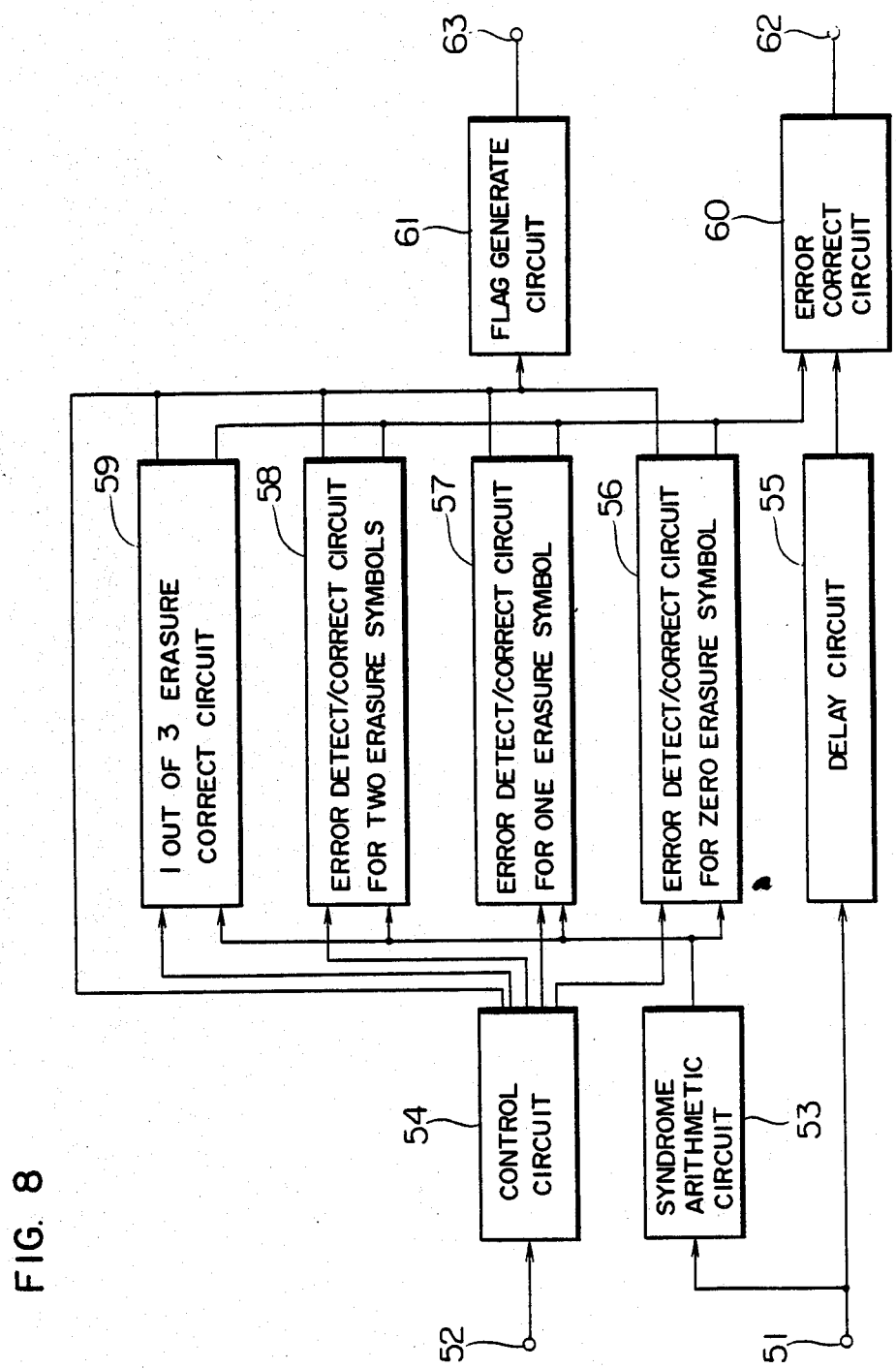
FIG. 8 is a schematic block diagram of a system using the 1 out of 3 erasure correcting method embodying the present invention.

FIG. 8 is a schematic block diagram illustrating a system using the 1 out of 3 erasure correcting method.

A syndrome circuit 53 calculates the syndromes $S_1$, $S_2$, and $S_3$ based on the reproduced data inputted from an input terminal 51 and output the calculated results. A control circuit 54 selects an error detect/correct circuit according to the erasure symbol positional information inputted from an input terminal 52. It selects error detect/correct circuits 56, 57, 58, or 1 out of 3 erasure correct circuit 59 when the number of erasure symbols is 0, 1, 2, or 3, respectively. When the number of erasure symbols exceeds three, the control circuit 54 selects a flag generate circuit 61 so as to detect an error. An error correct circuit 60 eliminates the errors obtained by the error detect/correct circuits 56 to 58 and 1 out of 3 erasure correct circuit 59 from the reproduced data delayed by a delay circuit 55, thereby performing the error correction. The data of which the errors have been suppressed is outputted from an output terminal 62. When an error is found in the error detect/correct circuits 56 to 58 or 1 out of 3 erasure correct circuit 59, or when the number of erasure symbols exceeds three, the flag generate circuit 61 generates an error flag to perform the error detection. The error flag thus generated is outputted from an output terminal 63.

Description of the 1 out of 3 erasure correct circuit 59 will be dispensed with because the operation thereof is substantially the same as the 2 out of 3 erasure circuit 34 of FIG. 6.

When designing the hardware system of the erasure correcting method, the amount of hardware elements required is mainly determined in accordance with the operations to be conducted over the Galois field GF ($q^m$) for calculating the size of the error with respect to the erasure symbol positions. If the operations are implemented by use of ROM's, the required number of ROM's is determined by the number of variables used in the operations executed over the Galois field GF ($q^m$). The numbers of variables over the Galois field GF ($q^m$) is represented by $a^i$, $a^j$, and $a^j S_1$ in expression (14), for example. The operations over the Galois field GF ($q^m$) necessary for the 2, 3, and 2 out of 3 erasure correcting methods are implemented by expressions (14) to (16), (18) to (20), (33) to (41), and (42) to (47), respectively. The number of variables necessary for each method is obtained as follows.

2 erasure correcting method (prior art): 5
3 erasure correcting method (prior art): 18
2 out of 3 erasure correcting method (embodiment of FIG. 1): 11
1 out of 3 erasure correcting method (embodiment of FIG. 8): 6

Although the amount of hardware elements of the erasure correcting methods in these embodiments is not so small as that of the 2 erasure correcting method, it is greatly lowered as compared with that of the 3 erasure correcting method.

Assume that the values of probability of detecting failure are $P_2$, $P_3$, $P_{2-3}$, and $P_{1-3}$ in the cases in which the 3 error detection is used in the operation for decoding the A code, and 2, 3, 2 out of 3, and 1 out of 3 erasure correcting methods are adopted in the operation for decoding the B code, respectively. The values of probability $P_2$, $P_3$, $P_{2-3}$, and $P_{1-3}$ are represented by expression (22). They are expressed as follows by use of the probability $P_c$ of detecting failure and the probability $P_E$ of erasure symbols on which a symbol error is actually found (expression (24)).

$$P_2 = 1 - \sum_{i=0}^{2} {}_{31}C_i P_c^i (1 - P_c)^{31-i} \qquad (48)$$

$$P_3 = 1 - \sum_{i=0}^{3} {}_{31}C_i P_c^i (1 - P_c)^{31-i} \qquad (49)$$

$$P_{2-3} = 1 - \sum_{i=0}^{3} {}_{31}C_i P_c^i (1 - P_c)^{31-i} - \qquad (50)$$

$$\qquad {}_{31}C_3 P_c^3 (1 - P_c)^{28} \cdot \sum_{i=0}^{2} {}_{3}C_i P_E^i (1 - P_E)^{3-i}$$

$$P_{1-3} = 1 - \sum_{i=0}^{2} {}_{31}C_i P_c^i (1 - P_c)^{31-i} - \qquad (51)$$

$$\qquad {}_{31}C_3 P_c^3 (1 - P_c)^{28} \cdot \sum_{i=0}^{1} {}_{3}C_i P_E^i (1 - P_E)^{3-i}$$

Figure 9:
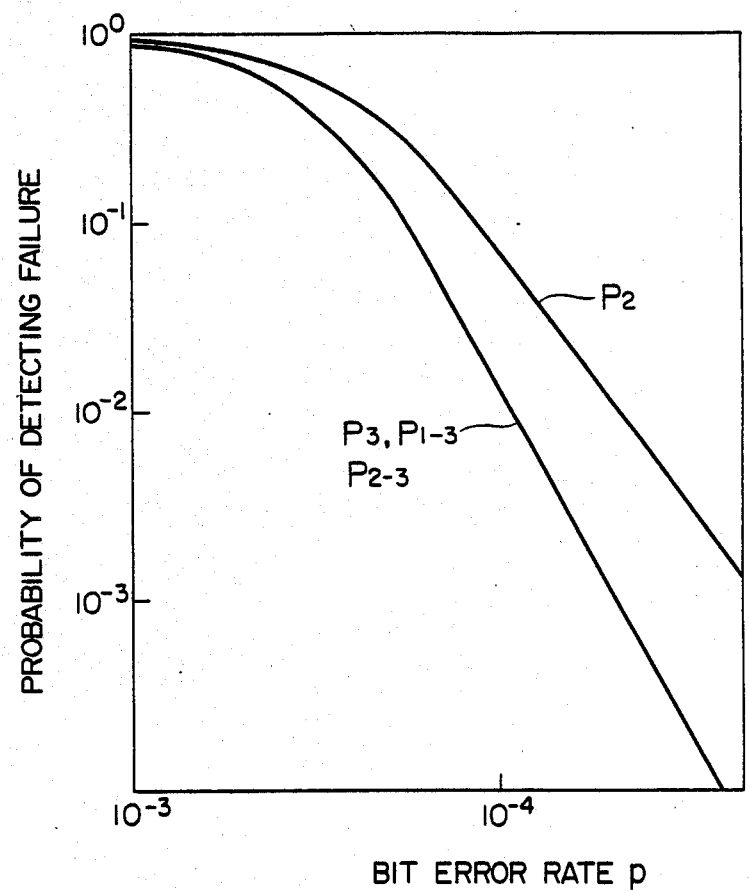
FIGS. 9-10 are graphs for explaining the effect of the present invention.

FIG. 9 is a graph showing the relationship between the bit error rate p and the probability of detecting failure $P_2$, $P_3$, $P_{2-3}$, and $P_{1-3}$.

In the similar manner, assume that the values of probability of detecting failure are $P'_2$, $P'_3$, $P'_{2-3}$, and $P'_{1-3}$ in the cases in which the 1 error correction 2 error detection is implemented in the operation for decoding the A code, and the 2, 3, 2 out of 3, and 1 out of 3 erasure correcting methods are employed in the operation for decoding the B code, then the values of P'$_2$, P'$_3$, P'$_{2-3}$, and P'$_{1-3}$ are expressed as follows.

$$P'_2 = 1 - \sum_{i=0}^{2} {}_{31}C_i P_c'^i (1 - P_c')^{31-i} \quad (52)$$

$$P'_3 = 1 - \sum_{i=0}^{3} {}_{31}C_i P_c'^i (1 - P_c')^{31-i} \quad (53)$$

$$P'_{2-3} = 1 - \sum_{i=0}^{2} {}_{31}C_i P_c'^i (1 - P_c')^{31-i} - \quad (54)$$

$${}_{31}C_3 P_c'^3 (1 - P_c')^{28} \cdot \sum_{i=0}^{2} {}_{3}C_i P_E'^i (1 - P_E')^{3-i}$$

$$P'_{1-3} = 1 - \sum_{i=0}^{2} {}_{31}C_i P_c'^i (1 - P_c')^{31-i} - \quad (55)$$

$${}_{31}C_3 P_c'^3 (1 - P_c')^{28} \cdot \sum_{i=0}^{1} {}_{3}C_i P_E'^i (1 - P_E')^{3-i}$$

Figure 10:
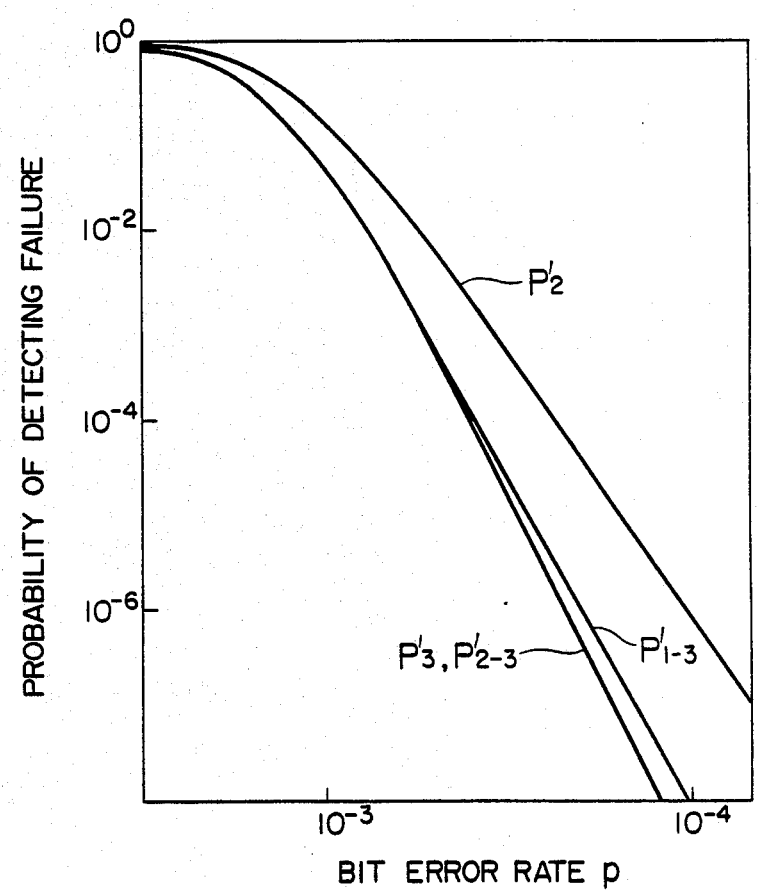

FIG. 10 is a graph illustrating the relationships between the bit error rate p and the values of probability of detecting failure P'$_2$, P'$_3$, P'$_{2-3}$, and P'$_{1-3}$.

It is clear from FIGS. 9-10 that the probability of detecting failure in the erasure correcting methods of the embodiments is substantially the same as that of the 3 erasure correcting method; moreover, it is greatly reduced as compared with that of the 2 erasure correcting method. In other words, the probability of detecting failure of the erasure correcting methods in accordance with the embodiments is substantially the same as that of the 3 erasure correcting method.

What has been shown and described is the evaluation of the erasure correcting methods assuming the random error as the symbol error. The similar evaluation can be made with respect to the burst error if the burst length is small or if the burst error density is low.

As described above, in accordance with the erasure correcting methods of the embodiments, the positions of erroneous symbols are determined among the erasure symbols and the number of correctable erroneous symbols is limited, thereby considerably reducing the size of the circuit required for the erasure correcting methods as compared with the conventional erasure correcting methods for which the data error is assumed to occur in all data of the erasure symbols. In addition, when the probability of erasure symbols on which the error is actually found becomes to be sufficiently small as is the case of the double-encoding code, the error correction capability of the erasure correcting methods used in the embodiments is hardly lowered as compared with the prior art methods. As a consequence, in accordance with the erasure correcting methods of the embodiments, a multi-erasure correcting method which develops a higher error correction capability can be implemented.

We claim:

1. An apparatus for decoding double-encoding codes comprising:
   a first decoder for adding an erasure flag, when an error is detected in a first data of double-encoding codes, to all symbols of said first data so as to generate erasure symbols; and
   a second decoder for inputting thereto the double-encoding codes decoded by said first decoder, for detecting the number of erasure symbols which are contained in the second data of the double-encoding codes and on which an error is found, for correcting the second data when the number of erasure symbols is at most a maximum number of correctable symbols, and for detecting an error of the second data when the number of erasure symbols is greater than the maximum number of correctable symbols.

2. An apparatus according to claim 1, wherein said first decoder detects an error when an error of the first data cannot be corrected.

3. An apparatus according to claim 1, wherein said first decoder checks the first data for an error and detects an error when an error is found therein.

4. An apparatus according to claim 1, wherein said second decoder detects the number of erasure symbols on which an error is found when the number of the erasure symbols contained in the second data is at most a constant, l, and detects an error when the number is greater than the constant, l.

5. An apparatus according to claim 4, wherein when the number of the erasure symbols contained in the second data does not exceed the constant, l, and is greater than the maximum number of correctable symbols, m (m<l), the number of erasure symbols on which an error is found is detected.

6. A method for decoding double-encoding codes comprising the steps of:
   adding an erasure flag, when an error is found in a first data of double-encoding codes, to all symbols of the first data;
   detecting the number of symbols to which the erasure flag is added in the second data of double-encoding codes and on which an error is found; and
   correcting the second data when the number of the symbols on which an error is found is at most a maximum number of correctable symbols.

* * * * *